(12) United States Patent
Winters et al.

(10) Patent No.: US 7,382,384 B2
(45) Date of Patent: Jun. 3, 2008

(54) OLED DISPLAYS WITH VARYING SIZED PIXELS

(75) Inventors: Dustin L. Winters, Webster, NY (US); Steven A. Van Slyke, Pittsford, NY (US)

(73) Assignee: Eastman Kodak Company, Rochester, NY (US)

( * ) Notice: Subject to any disclaimer, the term of this patent is extended or adjusted under 35 U.S.C. 154(b) by 583 days.

(21) Appl. No.: 11/005,745

(22) Filed: Dec. 7, 2004

(65) Prior Publication Data

US 2006/0119556 A1   Jun. 8, 2006

(51) Int. Cl.
*G09G 5/02* (2006.01)

(52) U.S. Cl. .................. 345/695; 345/694; 345/82

(58) Field of Classification Search ............ 345/82, 345/694, 695
See application file for complete search history.

(56) References Cited

U.S. PATENT DOCUMENTS

| | | | |
|---|---|---|---|
| 4,356,429 A | 10/1982 | Tang | |
| 6,281,634 B1* | 8/2001 | Yokoyama | 315/169.3 |
| 6,366,025 B1* | 4/2002 | Yamada | 315/169.3 |
| 6,771,028 B1* | 8/2004 | Winters | 315/169.1 |
| 7,102,293 B2* | 9/2006 | Matsumoto | 315/169.3 |
| 7,202,841 B2* | 4/2007 | Matsumoto | 345/76 |
| 2002/0101394 A1* | 8/2002 | Anzai | 345/76 |
| 2003/0067458 A1 | 4/2003 | Anzai | |
| 2004/0080479 A1* | 4/2004 | Credelle | 345/88 |
| 2004/0113875 A1 | 6/2004 | Miller et al. | |
| 2004/0164668 A1* | 8/2004 | Kanno et al. | 313/500 |
| 2004/0173819 A1 | 9/2004 | Matumoto | |
| 2004/0195963 A1* | 10/2004 | Choi et al. | 313/504 |
| 2004/0201558 A1* | 10/2004 | Arnold et al. | 345/83 |
| 2004/0217694 A1* | 11/2004 | Cok et al. | 313/504 |
| 2004/0222999 A1* | 11/2004 | Choi et al. | 345/589 |
| 2005/0068281 A1* | 3/2005 | Shin et al. | 345/88 |
| 2006/0028495 A1* | 2/2006 | Phan | 345/694 |
| 2006/0170712 A1* | 8/2006 | Miller et al. | 345/695 |

FOREIGN PATENT DOCUMENTS

| | | |
|---|---|---|
| EP | 1 473 772 | 11/2004 |
| JP | 2003-271076 | 9/2003 |
| JP | 2004-020704 | 1/2004 |

* cited by examiner

*Primary Examiner*—Amare Mengistu
*Assistant Examiner*—Eli M Sheets
(74) *Attorney, Agent, or Firm*—Raymond L. Owens

(57) ABSTRACT

An active matrix OLED display has pixels with light emitting areas arranged in rows and columns and includes; a first pixel having a first height in the column direction and disposed in a first column of pixels and in a first row of pixels; a second pixel having a second height in the column direction and disposed in the first column of pixels and in a second row of pixels wherein the second row of pixels is adjacent to the first row of pixels and the first height being different than the second height; and a first select line arranged to drive only the first row of pixels and a second select lines spaced from the first select line arranged to drive only the second row of pixels wherein the emitting areas of the first and second pixels are disposed between the first and second select lines.

8 Claims, 4 Drawing Sheets

OLED DISPLAYS WITH VARYING SIZED PIXELS

FIELD OF THE INVENTION

The present invention relates to OLED displays having different sized pixels.

BACKGROUND OF THE INVENTION

In the simplest form, an organic electroluminescent (EL) device is comprised of an anode for hole injection, a cathode for electron injection, and an organic media sandwiched between these electrodes to support charge recombination that yields emission of light. These devices are also commonly referred to as organic light emitting diodes, or OLEDs. A basic organic EL element is described in U.S. Pat. No. 4,356,429. In order to construct a pixelated OLED display such as is useful as a display such as, for example, a television, computer monitor, cell phone display, or digital camera display, individual organic EL elements can be arranged as pixels in a matrix pattern. These pixels can all be made to emit the same color, thereby producing a monochromatic display, or they can be made to produce multiple colors such as a red, green, blue (RGB) display. For purposes of this disclosure, a pixel is considered the smallest individual unit which can be independently stimulated to produce light. As such, the red pixel, the green pixel and the blue pixel are considered as three distinct pixels.

Color organic EL displays have also recently been described that are constructed as to have four differently colored pixels. One type of display having four differently colored pixels that are red, green, blue, and white in color is known as an RGBW design. Examples of such four pixel displays are shown in U.S. Pat. No. 6,771,028, U.S. Patent Application Publication US2002/0186214A1, and U.S. Patent Application Publication US2004/0113875A1. Such RGBW displays can be constructed using a white organic EL emitting layer with red, green, and blue color filters. The white pixel area is left unfiltered. This design has the advantage of lower power consumption and current density compared to a three-color filtered white-emitting organic EL displays by using the higher efficiency white pixels to produce a portion of gray scale colors.

Organic EL displays are sometimes driven with active matrix circuitry. Active matrix circuitry typically consists of active circuit components such as multiple transistors and one or more capacitors per pixel. Active matrix circuitry components also comprises signal lines such as power lines for supplying electric power to the pixels, data lines for supplying a voltage or current signal to adjust the brightness of the pixels, and select lines for sequentially activating a row of pixels thereby causing the pixels of each row to adjust in brightness in response to the signal of the data lines. The signal lines are typically shared by either a row or a column of pixels. These circuit components permit the pixels to remain illuminated even when the pixels are not being directly addressed. Examples of organic EL displays driven by active matrix circuitry are shown in U.S. Pat. Nos. 5,550,066, 6,281,634, and 6,456,013.

It is known that the efficiency of organic EL displays decreases over time with use. It is also known that the rate of decay in the efficiency is dependant on the electric current per unit of surface area (hereafter referred to as current density) applied to the organic light emitting diode. For multicolored organic EL displays, it is therefore often desirable to adjust size of the emitting areas of each the differently colored pixel so as to reduce the current density in pixels which are driven more frequently, are of lower efficiency, or are constructed of materials which decay more rapidly with increased current density. In such a configuration, for example, a low efficiency color pixel having a rapid rate of decay may be provided with a larger emitting area than a different colored pixel that is more efficient so that the desired brightness of the lower efficiency pixel can be achieved at a lower current density thereby increasing display lifetime. By adjusting the size of the emitting areas of the differently colored pixel, and thereby the current densities, the lifetimes of the organic EL elements in each pixel can thereby be balanced lessening the possibility that a particular colored pixel with decay more quickly than other colored pixels. Examples of organic EL displays having differently colored pixels where the emitting area of the differently color pixels has been optimized are shown in U.S. Pat. Nos. 6,366,025 and 6,747,618 and U.S. Patent Application Publications US2004/0164668A1 and US2004/0173819A1.

In an organic EL display, the pixels are arranged in a series of rows and columns. The simplest arrangement is a strip pattern where the pixels are aligned in both the row and column direction. In such a stripe arrangement, pixels having the same color may be aligned in the same direction such as the column direction. Alternate arrangements where the same colored pixels are not arranged in a row or column direction have also been shown. For example, the delta pattern, where the red, green, and blue pixels are arranged in a triangular fashion is known in the art. Examples of these various pixel arrangements may be found in U.S. Pat. Nos. 6,281,634, 6,456,013 and 6,768,482 and U.S. Patent Application Publication US2003/067458A1. Other patterns, such as a quad pattern have been shown which are particularly useful for displays having four differently colored pixels such as an RGBW display. In a quad pattern, four differently colored pixels are arranged in a rectangular fashion with each differently colored pixel disposed in a different corner of the rectangle. Examples of quad patterns are shown in U.S. Pat. No. 6,771,028.

When these various pixels patterns are coupled with the active matrix circuitry, the arrangement of the circuit components and signal lines typically must be adjusted to accommodate the pixel pattern. This is particularly true for displays having a configuration where the active matrix circuit components are located in a plane between the plane of the organic EL elements and the viewer. This is because, in this configuration, the circuit components and signal lines are typically opaque and would therefore block the light intended for the viewer.

As shown in U.S. Pat. No. 6,747,618, one approach to adjusting the size of the emitting areas of the differently colored pixels is to change the widths of the pixels while making the heights of the pixels the same. This approach is particularly useful when applied to patterns such as the stripe pattern, because the signal lines can be routed in a linear fashion in both the row and column directions without having to bend the signal lines. Bending the signal lines is undesirable because bent signal lines are effectively longer and therefore more resistive. Bent signal lines also require more area in the plane of the active matrix circuitry leaving less area for other circuit components.

However, when applied to other patterns in which differently colored pixels are located in the same rows and columns, this approach becomes impractical. This is because each differently colored pixel will have, preferably, a differently sized emitting area. As such, for example, the widths of the pixels may need to be adjusted to optimize for differently colored pixels in the same row and the heights of the pixels may need to be adjusted to optimize for differently colored pixels in the same column.

As shown in the prior art described above, signal lines are typically located between the emitting areas of each pixel. For example, in the row direction, a select line may be located between each of the emitting areas of two adjacent rows of pixels. Adjusting the size of the emitting areas in both the row and column direction would result in the circuit components and signal lines needing to be routed around the emitting regions of the pixels. However, routing the signal lines around the emitting regions of the pixels results in the signal lines becoming bent as describe above.

SUMMARY OF THE INVENTION

It is therefore an object of the present invention to provide a new active matrix OLED display circuitry configuration having pixels with varying sized emitting areas that overcomes the above problems and has reduced resistance.

This object is achieved by an active matrix OLED display having pixels with light emitting areas arranged in rows and columns comprising;

(a) a first pixel having a first height in the column direction and disposed in a first column of pixels and in a first row of pixels;

(b) a second pixel having a second height in the column direction and disposed in the first column of pixels and in a second row of pixels wherein the second row of pixels is adjacent to the first row of pixels and the first height being different than the second height; and (c) a first select line arranged to drive only the first row of pixels and a second select lines spaced from the first select line arranged to drive only the second row of pixels wherein the emitting areas of the first and second pixels are disposed between the first and second select lines.

This object is further achieved by an active matrix OLED display having pixels with light emitting areas arranged in rows and columns comprising;

(a) a first pixel disposed in a first column of pixels and in a first row of pixels wherein the fist pixel has a first width in the row direction and a first height in the column direction;

(b) a second pixel disposed in the first column of pixels and in a second row of pixels wherein the second pixel has a second width in the row direction and the second width is different than the first width and;

(c) at least a third pixel disposed in a second column of pixels and in the first row of pixels wherein the third pixel has a second height in the column direction and the second height is different than the first height.

The invention has the advantage over prior OLED active matrix display designs that pixels having differing colors can be located in both the same row and column and can be optimized to have differing emitting area sizes having differing heights and widths. The invention also has the advantage that signal lines have reduced resistance and require less surface area.

Since feature dimensions such as layer thicknesses are frequently in sub-micrometer ranges, the drawings are scaled for ease of visualization rather than dimensional accuracy.

DETAILED DESCRIPTION OF THE INVENTION

Figure 1:
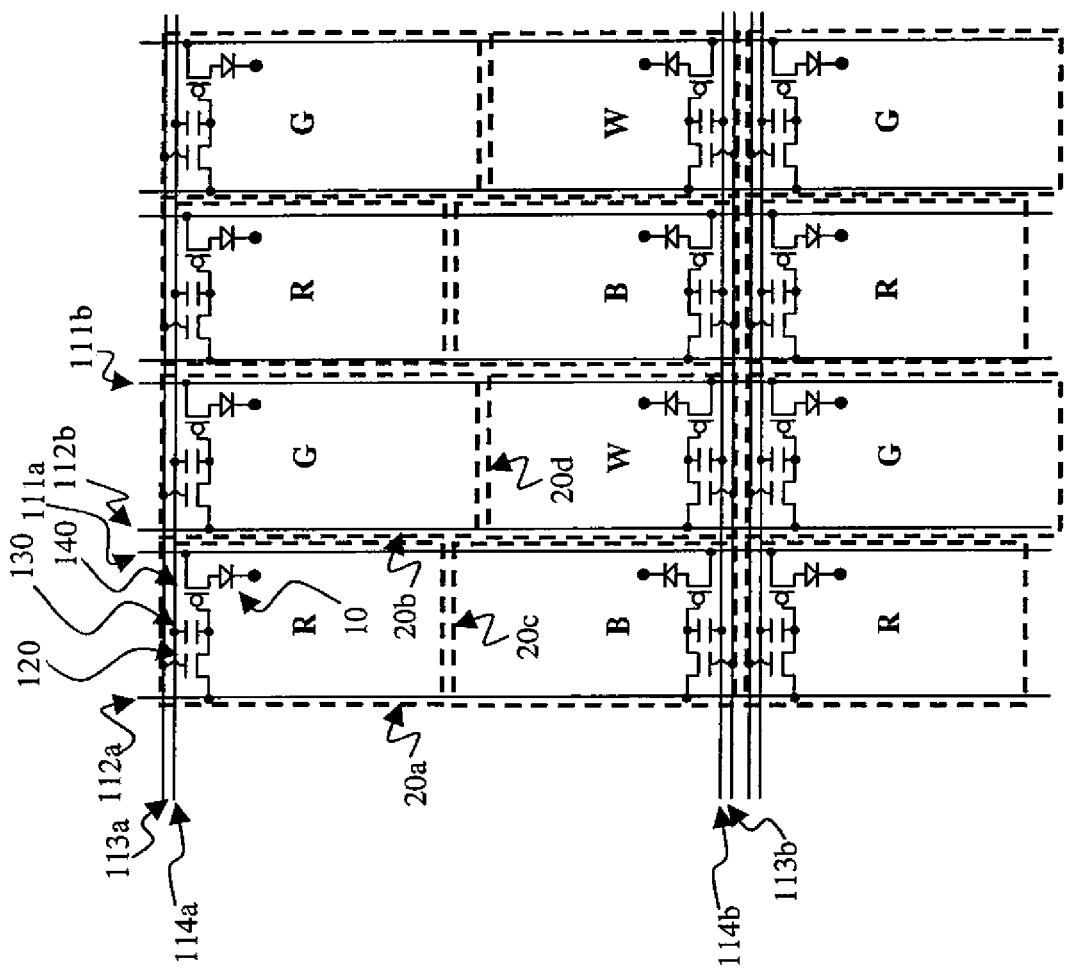
FIG. 1 shows a circuit pattern diagram according to the present invention.

Turning now to FIG. 1, there is shown a circuit pattern diagram according to the present invention. The display is a four-color OLED display that is formed from a plurality of pixels such as pixels 20*a*, 20*b*, 20*c*, and 20*d*. In this example, pixels 20*a*, 20*b*, 20*c*, and 20*d* each emit different colored light such, for example, red, green, blue, and white light respectively. However, the present invention is not limited to this case and can be made to work by one skilled in the art with a variety of pixel combinations, both in color and number of different colors, to achieve the desired display properties.

FIG. 1 shows the active matrix drive circuitry used to drive the pixels of the display. The active matrix drive circuitry is composed of signal lines such as select line 113*a*, select line 113*b*, capacitor line 114*a*, capacitor line 114*b*, data line 112*a*, data line 112*b*, power line 111*a*, and power line 111*b*. These signal lines are common to a row or a column of pixels as shown and drive the pixels of the row or column. The active matrix drive circuitry further includes components such as select transistor 120, power transistor 140, and storage capacitor 130, which together with one of more of the signal lines are arranged to drive the organic light emitting diode 10 of pixel 20*a*. The other pixels are provided with similar components to drive the respective organic light emitting diodes of the pixels. A common top electrode connection (not shown) is connected to cathodes of all the organic light emitting diodes to complete the circuit.

The pixels 20*a*, 20*b*, 20*c* and 20*d* are arranged in a matrix of rows and columns. That is, for example, pixel 20*a* and pixel 20*b* are arranged in a first row. Select line 113*a* and capacitor line 114*a* are shared by the pixels in this first row. Pixel 20*c* and pixel 20*d* are arranged in a second row of pixels. This second row of pixels is adjacent to the first row of pixels. Select line 113*b* and capacitor line 114*b* are shared by the pixels in this second row. Pixel 20*a* and pixel 20*c* are arranged in a first column. Data line 112*a* and power line 111*a* are shared by the pixels in this first column. Pixel 20*b* and pixel 20*d* are arranged in a second column. This second column of pixels is adjacent to the first column of pixels. Data line 112*b* and power line 111*b* are shared by the pixels in this second column. While, only a limited number of rows and columns are shown, this design can be expanded to provide for a plurality of rows and columns. Alternate arrangements can also be practiced. For example, the power line may be arranged so as to be shared by two adjacent columns. Alternately, the power line may be run in the same row direction instead of the column direction and be shared by the pixels of the row. Also, other more complex pixel circuits having more transistors in various arrangements are known in the art and can also be applied to the present invention by one skilled in the art.

The drive circuitry operates in a manner well known in the art. Each row of pixels is selected by applying a voltage signal to the select line, such as select line 113*a*, which turns on the select transistor, such as select transistor 120, for each pixel. The brightness level, or gray scale information, for each pixel is controlled by a voltage signal, which has been set on the data lines such as data line 112a and data line 112b. The storage capacitor, such as storage capacitor 130, for each pixel is then charged to the voltage level of the data line associated with that pixel and maintains the data voltage until the row is selected again during the next image frame. The storage capacitor 130 is connected to the gate of the power transistor 140 so that the voltage level held on storage capacitor 130 regulates the current flow through the power transistor 140 to the organic light emitting diode 10 and thereby controls the pixel's brightness. Each row is then un-selected by applying a voltage signal to the select line which turns off the select transistors. The data line signal values are then set to the levels desired for the next row and the select line of the next row is turned on. This is repeated for every row of pixels.

As such, select lines are signal lines that serve the function of isolating a row of pixels so that the gray scale information can be loaded into the pixels or the row. Data lines are signal lines that provide the gray scale information to the pixels. This gray scale information may be in the form of a voltage or current signal. Power lines are signal lines which provide a source or electrical power to the organic light emitting diodes of the pixels for maintaining the brightness level of the pixel, at least during the time when the pixels row is not selected by the select line. Many different alternate types of circuit arrangements known in the art having various arrangements and numbers of circuit components and signal lines are constructed with signal lines serving these basic functions, and the present invention may be practiced on the alternate types of circuit arrangements by one skilled in the art. As such, the present invention is not limited to the specific circuit arrangement shown here.

Figure 2:
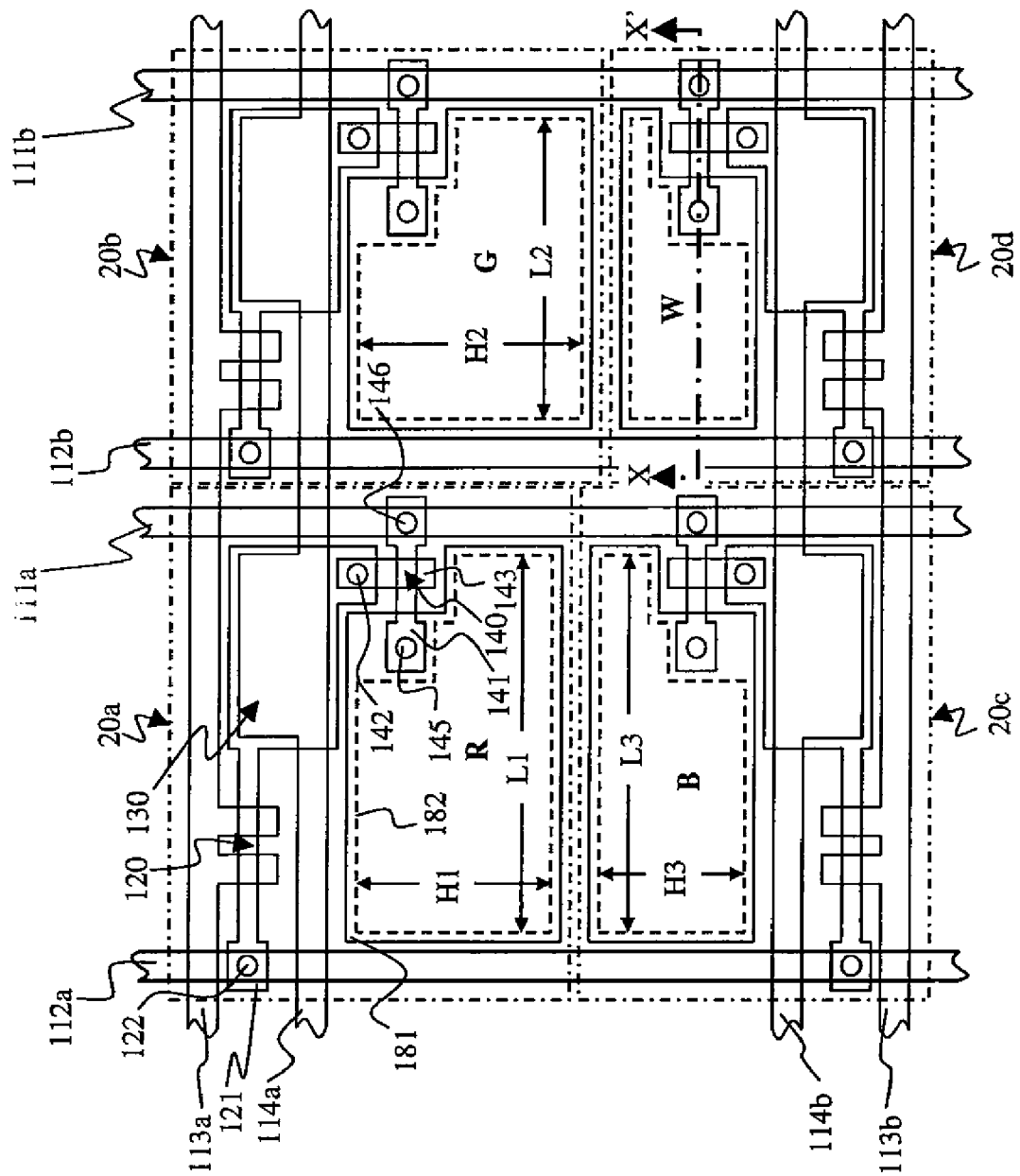
FIG. 2 shows a layout pattern diagram according to the first layout embodiment of the present invention.

A layout diagram for the portions of the drive circuitry used to drive pixel 20a, 20b, 20c, and pixel 20d according to the first layout embodiment of the present invention is shown is shown in FIG. 2. FIG. 2, shows the construction of the various circuit components such as select transistor 120, storage capacitor 130, and power transistor 140. The drive circuitry components are fabricated using conventional integrated circuit and thin film transistor fabrication technologies. Select transistor 120 is formed from a first semiconductor region 121 using techniques well known in the art. Select transistor 120 is shown as a double gate type transistor, however, this is not required for successful practice of the present invention and a single gate type transistor could also be used. Similarly, power transistor 140 can be formed in a second semiconductor region 141. The first semiconductor region 121 and second semiconductor region 141 are typically formed in the same semiconductor layer. This semiconductor layer is typically silicon and is preferably polycrystalline or crystalline, but can also be amorphous. This first semiconductor region 121 also forms one side of storage capacitor 130. Over the first semiconductor region 121 and second semiconductor region 141 is an insulating layer (not shown) that forms the gate insulator of select transistor 120, the gate insulator for power transistor 140, and the insulating layer of storage capacitor 130. The gate of select transistor 120 is formed from part of select line 113a, which is formed in the first conductor layer. Power transistor 140 has a separate power transistor gate 143 also preferably formed in the first conductor layer. The other electrode of storage capacitor 130 is formed as part of capacitor line 114a, also preferably formed from the first conductive layer.

Power line 111a and data line 112a are preferably formed from a second conductive layer. One or more of the signal lines (e.g. select line 113a) frequently cross at least one or more of the other signal lines (e.g. data line 112a), which results in these lines being preferably fabricated from multiple conductive layers with at least one interlayer insulating layer (not shown) in between. The first electrode 181 of the organic light emitting diode is connected to power transistor 140. An insulating layer (not shown) is located between the first electrode 181 and the second conductive layer.

Connections between layers are formed by etching holes (or vias) in the insulating layers such as via 122 connecting data line 112a to the first semiconductor region 121. Similarly, via 142 connects the power transistor gate 143 to first semiconductor region 121, via 146 connects the second semiconductor region 141 to power line 111a, and the via 145 connects the second semiconductor region 141 to the first electrode 181.

First electrode 181 serves to provide electrical contact to the organic electroluminescent media of the organic light emitting diodes. Over the perimeter edges first electrode 181, an interpixel dielectric layer may be formed to cover the edges of the electrodes and reduce shorting defects as described below. Opening 182 is made in the insulating area over the first electrode 181 to permit the first electrode 181 to make electrical contact with the organic electroluminescent media of the organic light emitting diode. The emitting area of pixel 20a is defined by the areas of the first electrode 181 that is in electrical contact with the organic electroluminescent media. As such, the emitting area is the area of the first electrode 181 reduced by any area covered by dielectric material. Therefore, when an interpixel is used as described, the emitting area is the area of the opening, such as opening 182, in the the interpixel dielectric. While use of such interpixel dielectrics is preferred, it is not required for successful practice of the present invention.

Each of the differently colored pixels can have different efficiencies and lifetimes. Therefore, the emitting area for each differently colored pixel will be optimized differently. Several approaches to optimizing the emitting area are known in the art, examples of which can be found in U.S. Pat. Nos. 6,366,025 and 6,747,618.

The emitting areas of the pixels can be adjusted without bending of any of the signal lines by adjusting the size of the emitting area in the column direction, or height (H), or adjusting the size of the emitting area in the row direction, or width (L). According to the first embodiment of the present invention, by disposing select line 113a and select line 113b on the outside of their associated pixels, different heights of the pixel emitting areas can be achieved for pixels in the same row, as shown. That is, the emitting areas of pixels 20a, 20b, 20c, and 20d are disposed between select line 113a and select line 113b, permitting the select lines to be formed in a linear, unbending, fashion. That is, a signal line, such as the select line, are considered to be linear if they form a straight path between all the pixels connected to the signal line. The signal line may vary in width along its length and still be considered linear. Therefore by providing the select lines of these two adjacent rows of pixels on the outside of their associated pixels, pixels in the same row may be provided with different heights, such as height H1 of pixel 20a and height H2 of pixel 20b. Pixels in the same row may also be provided with different widths such as width L1 of pixel 20a and width L2 of pixel 20b. Pixels in the same column generally have the same width. For example, pixel 20a has a width L1, which is the same as width L3 of pixel 20c. Pixels in the same column, however, may have differing heights such as height H1 of pixel 20a and height H3 of pixel 20c. These heights and widths are thereby balanced so that each differently colored pixel has the desired emitting area. This arrangement thereby permits pixels in the same row to have different emitting areas and pixels in the same column to also have different emitting areas without bending signal lines. Therefore, differently colored pixels may be disposed in the same column and in the same row. In this arrangement, data line 112a, data line 112b, power line 111a, and power line 111b are also preferably formed in a linear fashion.

It is not necessary that the pixel emitting areas be perfectly rectangular, as irregularities in the emitting areas, as shown, may be provided to conform to the areas of the circuit components, such as the transistors. In this case, the width of the emitting area may be considered the maximum width in the row direction and the height of the emitting area may be considered the maximum height in the column direction.

One or more of the pixels may further include a color filter element (not shown) to alter the spectrum of the emitted light of the pixel. The color filter elements are disposed between the organic electroluminescent media and the viewer.

Figure 3:
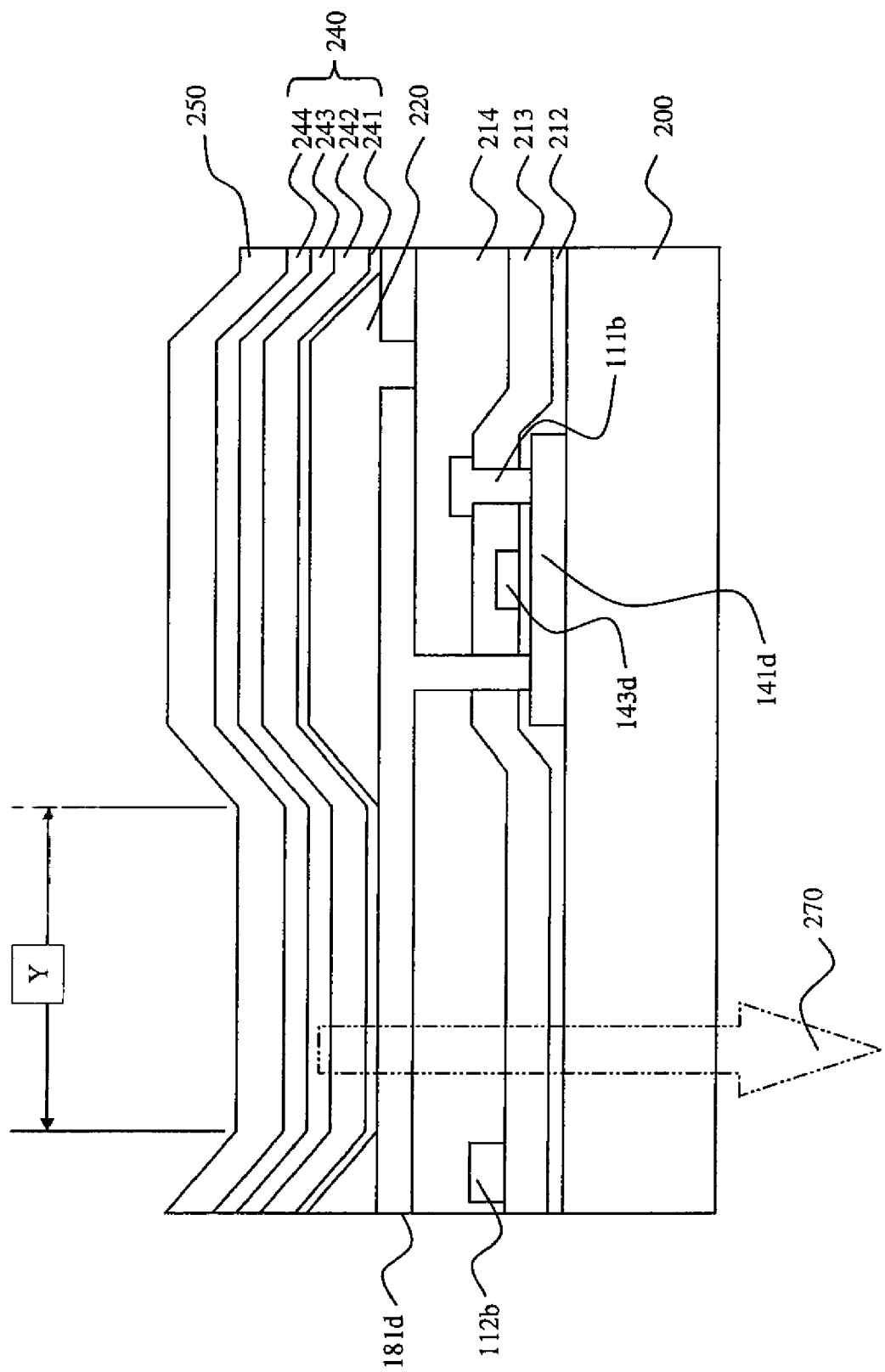
FIG. 3 shows a cross sectional view of a OLED display according to the present invention.

A cross-sectional view illustrating the vertical arrangement of the various layers of the OLED display of FIG. 2 along line X-X' is shown in FIG. 3. The OLED display including the drive circuitry and the organic EL media 240 are formed on substrate 200. Many materials can be used for substrate 200 such as, for example, glass and plastic. The substrate 200 may be further covered with one or more barrier layers (not shown). If the OLED display is intended to be operated such that light generated by the pixels is viewed through the substrate, the substrate should be transparent. This configuration is known as a bottom emitting configuration. In this case, materials for the substrate such as glass or transparent plastics are preferred.

Above substrate 200 a first semiconductor layer is provided, from which semiconductor region 141d is formed. Above semiconductor region 141d, first dielectric layer 212 is formed and patterned by methods such as photolithography and etching. This dielectric layer is preferably silicon dioxide, silicon nitride, or a combination thereof. It may also be formed from several sub-layers of dielectric material. Above first dielectric layer 212, a first conductor layer is provided, from which power transistor gate 143d is formed and patterned by methods such as photolithography and etching. This conductor layer can be, for example, a metal such as Cr, as is known in the art. Above power transistor gate 143d, a second dielectric layer 213 is formed. This dielectric layer can be, for example, silicon dioxide, silicon nitride, or a combination thereof. Above second dielectric layer 213, a second conductor layer is provided, from which power line 111b and data line 112b are formed and patterned by methods such as photolithography and etching. This conductor layer can be, for example, a metal such as an Al alloy as is known in the art. Power line 111b makes electrical contact with semiconductor region 141d through a via opened in the dielectric layers. Over the second conductor layer, a third dielectric layer 214 is formed.

Above the third dielectric layer, a first electrode 181d is formed. First electrode 181d is preferably highly transparent for the case of a bottom emitting configuration and may be constructed of a material such as ITO. Above first electrode 181d, an inter-pixel dielectric 220 layer, such as is described in U.S. Pat. No. 6,246,179, is preferably used to cover the edges of the first electrodes in order to prevent shorts or strong electric fields in this area. While use of the inter-pixel dielectric 220 layer is preferred, it is not required for successful implementation of the present invention. As described previously, the area of the first electrode 181d not covered by inter-pixel dielectric 220 constitutes the emitting area and is represented on the this cross-section view as dimension Y.

Each of the pixels further includes an organic EL media 240. There are numerous configurations of the organic EL media 240 layers wherein the present invention can be successfully practiced. For the organic EL media, a broadband or white light source which emits light at the wavelengths used by all the pixels may be used to avoid the need for patterning the organic EL media between pixels. In this case, color filters (not shown) may be provided for some of the pixels in the path of the light to produce the desired light colors from the white or broadband emission for a multicolor display. Pixels that are to emit the same the white or broadband emission as the organic EL media may remain unfiltered. Some examples of organic EL media layers that emit broadband or white light are described, for example, in U.S. Pat. No. 6,696,177. However, the present invention can also be made to work where each pixel has one or more of the organic EL media layers separately patterned for each pixel to emit differing colors for specific pixels. The organic EL media 240 is constructed of several layers such as; a hole injecting layer 241, a hole transporting layer 242 that is disposed over the hole injecting layer 241, a light-emitting layer 243 disposed over the hole transporting layer 242, and an electron transporting layer 244 disposed over the light-emitting layer 243. Alternate constructions of the organic EL media 240 having fewer or more layers can also be used to successfully practice the present invention. These organic EL media layers are typically include organic materials which are either small molecule materials or polymer materials as is known in the art. These organic EL media layers can be deposited by several methods known in the art such as, for example, thermal evaporation in a vacuum chamber, laser transfer from a donor substrate, or deposition from a solvent by use of an ink jet print apparatus.

Above the organic EL media 240, a second electrode 250 is formed. For a bottom emitting configuration, this electrode is preferably highly reflective and may be composed of a metal such as aluminum or silver or magnesium silver alloy. The second electrode 250 may also include an electron injecting layer (not shown) composed of a material such as lithium to aid in the injection of electrons. When stimulated by an electrical current between first electrode 181d and second electrode 250, the organic EL media 240 produces light emission 270.

Most OLED displays are sensitive to moisture or oxygen, or both, so they are commonly sealed in an inert atmosphere such as nitrogen or argon, along with a desiccant such as alumina, bauxite, calcium sulfate, clays, silica gel, zeolites, alkaline metal oxides, alkaline earth metal oxides, sulfates, or metal halides and perchlorates. Methods for encapsulation and desiccation include, but are not limited to, those described in U.S. Pat. No. 6,226,890. In addition, barrier layers such as SiOx, Teflon, and alternating inorganic/polymeric layers are known in the art for encapsulation.

OLED displays of this invention can employ various well-known optical effects in order to enhance its properties if desired. This includes but is not limited to optimizing layer thicknesses to yield maximum light transmission, providing dielectric mirror structures, replacing reflective electrodes with light-absorbing electrodes, providing anti-glare or anti-reflection coatings over the display, providing a polarizing media over the display, or providing colored, neutral density, or color conversion filters over the display.

While the above embodiment has been described with particular configuration of materials, many variations of the materials by which the present invention can be successfully practiced are known in the art. While a white emitting Organic EL material with a color filter array can be used to obtain a four pixel configuration, four colors can also be obtained by using four different organic EL configurations which are separately patterned over the pixels.

While the embodiments described herein refers to a specific configuration of active matrix drive circuitry and pixel design, several variations of conventional circuits that are known in the art can also be applied to the present invention by those skilled in the art. For example, one variation in U.S. Pat. No. 5,550,066 connects the capacitors directly to the power line instead of a separate capacitor line. A variation in U.S. Pat. No. 6,476,419 uses two capacitors disposed directly over one and another, wherein the first capacitor is fabricated between the semiconductor layer and the gate conductor layer that forms gate conductor, and the second capacitor is fabricated between the gate conductor layer and the second conductor layer that forms power lines and data lines.

While the drive circuitry described herein uses a select transistor and a power transistor, several variations of these transistor designs are known in the art. For example, single- and multi-gate versions of transistors are known and have been applied to select transistors in prior art. A single-gate transistor includes a gate, a source and a drain. An example of the use of a single-gate type of transistor for the select transistor is shown in U.S. Pat. No. 6,429,599. A multi-gate transistor includes at least two gates electrically connected together and therefore a source, a drain, and at least one intermediate source-drain between the gates. An example of the use of a multi-gate type of transistor for the select transistor is shown in U.S. Pat. No. 6,476,419. This type of transistor can be represented in a circuit schematic by a single transistor or by two or more transistors in series in which the gates are connected and the source of one transistor is connected directly to the drain of the next transistor. While the performance of these designs can differ, both types of transistors serve the same function in the circuit and either type can be applied to the present invention by those skilled in the art. The example of the preferred embodiment of the present invention is shown with a multi-gate type select transistor 120 which is represented by a single transistor symbol in the circuit schematic diagrams FIG. 1.

Also known in the art is the use multiple parallel transistors, which are typically applied to power transistor 140. Multiple parallel transistors are described in U.S. Pat. No. 6,501,448. Multiple parallel transistors consist of two or more transistors in which have their sources connected together, their drains connected together, and their gates connected together. The multiple transistors are separated, or spaced, within the pixels so as to provide multiple parallel paths for current flow. The use of multiple parallel transistors has the advantage of providing robustness against variability and defects in the semiconductor layer manufacturing process. While the power transistors described in the various embodiments of the present invention are shown as single transistors, multiple parallel transistors can be used by those skilled in the art and are understood to be within the spirit of the invention.

Figure 4:
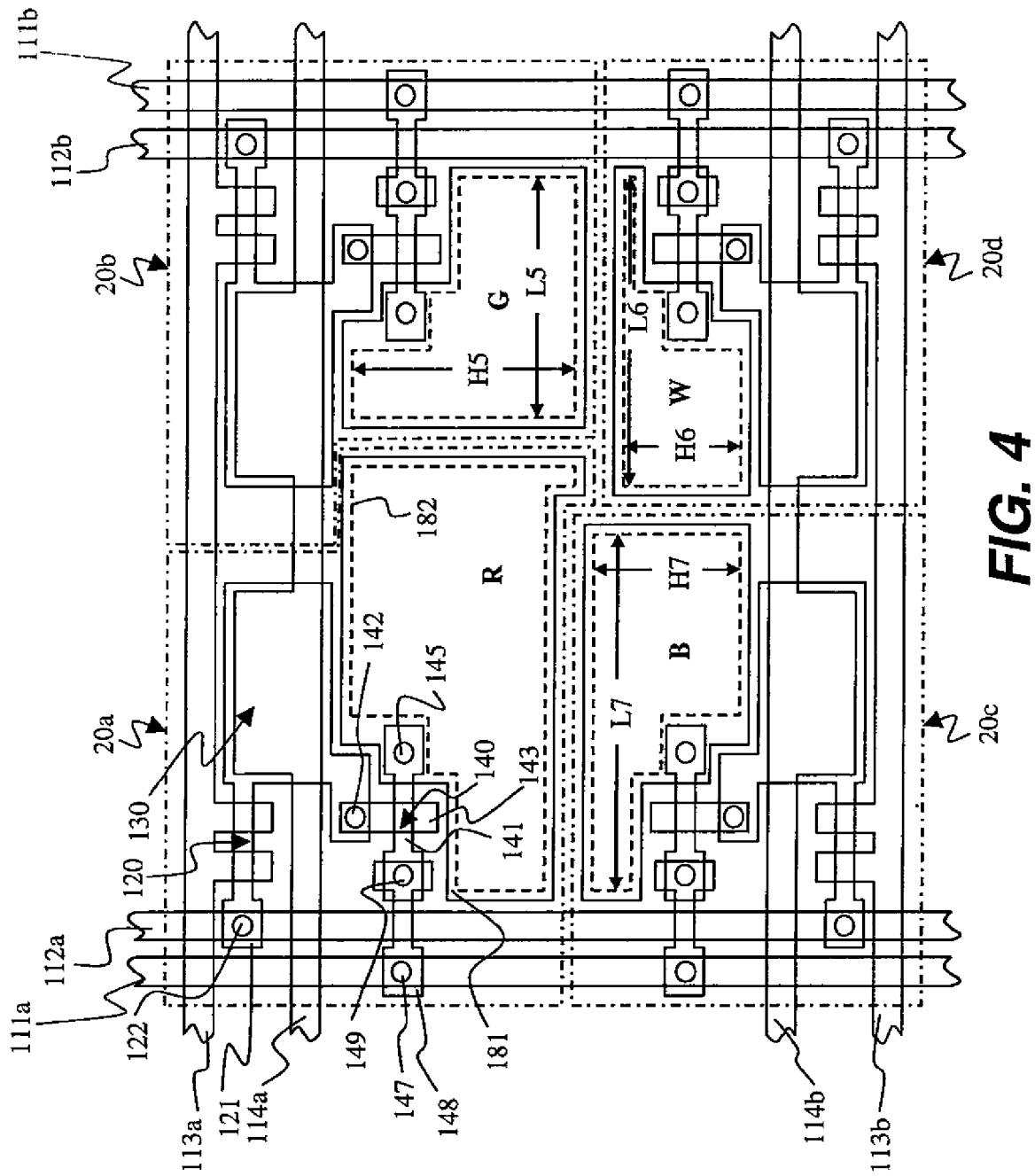
FIG. 4 shows a layout pattern diagram according to the second layout embodiment of the present invention.

A layout diagram according to the second layout embodiment of the present invention for the portions of the drive circuitry used to drive pixel 20*a*, 20*b*, 20*c*, and pixel 20*d* is shown is shown in FIG. 4. In the second layout embodiment, select line 113*a* and select line 113*b* are again disposed so that the emitting areas of their connected pixels, such as pixels 20*a*, 20*b*, 20*c*, and 20*d*, are disposed between the select lines. In other words, the emitting areas of two rows of pixels are disposed between this pair of select lines. In the second layout embodiment, the data lines and power lines are also disposed such that the emitting areas of two columns of pixels are disposed between both a pair of data lines and between a pair of power lines. For example, data lines 112*a* and 112*b* as well as power lines 111*a* and 111*b* are disposed such that the emitting areas of pixels 20*a*, 20*b*, 20*c*, and 20*d* are disposed between both of the data lines and between both of the power lines.

In this configuration, where both the data lines and the column lines are formed in the column direction, the data lines and the power lines are formed on the same side of the pixels' emitting areas. As such, electrical connection from one of one of these signal lines must cross the other signal line. For example, to make electrical connection between power line 111*a* and power transistor 140*a*, conductor bridge 148 may be used. Conductor bridge 148 is, for example, formed in the first conductor layer. Conductor bridge 148 is connected to power line 111 by means of via 147 and to the second semiconductor region 141 by means of via 149. Use of such conductors bridges is preferred, but is not always required for successful implementation of the present invention.

Power line 111*a* may be dedicated to the pixels in the same column as pixels 20*a* and 20*c*. Alternately, power line 111*a* may also be shared with pixels in the neighboring column (not shown) such that power line 111*a* provides power to two columns of pixels and is disposed between the columns. Similarly, power line 111*b* may be dedicated to the pixels in the same column as pixels 20*b* and 20*d* or be shared with pixels in the neighboring column (not shown) such that power line 111*b* also provides power to two columns of pixels and is disposed between the columns.

By forming a display according to the second layout embodiment, the emitting areas of the pixels can be adjusted without bending of any of the signal lines by adjusting the size of the emitting area in the column direction, or height (H), or adjusting the size of the emitting area in the row direction, or width (L). According to the second embodiment of the present invention, different heights of the pixel emitting areas can be achieved for pixels in the same row and different widths of the pixel emitting area can be achieved for pixels in the same column, as shown. That is, the emitting areas of pixels 20*a*, 20*b*, 20*c*, and 20*d* are disposed between select line 113*a* and select line 113*b*, between power line 111*a* and power line 111*b*, and between data line 112*a* and data line 112*b*, permitting these signal lines to be formed in a linear, unbending, fashion. Therefore, pixels in the same row may be provided with different heights, such as height H6 of pixel 20*d* and height H7 of pixel 20*c*. Pixels in the same row may also be provided with different widths such as width L6 of pixel 20*d* and width L7 of pixel 20*c*. Pixels in the same column may also be provided with different heights, such as height H6 of pixel 20*d* and height H5 of pixel 20*b*. Pixels in the same column may also be provided with different widths, such as width L6 of pixel 20*d* and width L5 of pixel 20*b*. These heights and widths are balanced so that each differently colored pixel has the desired emitting area. This arrangement thereby permits pixels in the same row to have different emitting areas and pixels in the same column to also have different emitting areas without bending signal lines. Therefore, differently colored pixels may be disposed in the same column and also in the same row. In this arrangement, the select lines, data lines, and power lines are preferably arranged to be linear.

It is not necessary that the pixel emitting areas be perfectly rectangular, as irregularities in the emitting areas, as shown, may be provided to conform to the areas of the circuit components, such as the transistors. In this case, the width of the emitting area may be considered the maximum width in the row direction and the height of the emitting area may be considered the maximum height in the column direction.

In an alternate embodiment, the power lines may be formed in the row direction. In this case, the power lines would be formed along side the select lines. In this case, the power lines would preferably be formed in the same conductor layer as the select lines and a connection would need to be made across either the power line or select line to the transistors of the pixels, either directly or by use of conductor bridges. In this alternate embodiment, the power lines could be dedicated for each row of pixels, or be shared by two neighboring rows.

The invention has been described in detail with particular reference to certain preferred embodiments thereof, but it will be understood that variations and modifications can be effected within the spirit and scope of the invention.

PARTS LIST

10 Organic Light Emitting Diode
20a pixel
20b pixel
20c pixel
20d pixel
111a power line
111b power line
112a data line
112b data line
113a select line
113b select line
114a capacitor line
114b capacitor line
120 select transistor
121 first semiconductor region
122 via
130 storage capacitor
140 power transistor
141 second semiconductor region
141d semiconductor region
142 via
143 power transistor gate
143d power transistor gate
145 via
146 via
147 via
148 conductor bridge
149 via
181 first electrode
181d first electrode
182 opening
200 substrate
212 first dielectric layer
213 second dielectric layer
214 third dielectric layer
220 inter-pixel dielectric layer
240 organic EL media
241 hole injecting layer
242 hole transporting layer
243 light emitting layer
244 electron transporting layer
250 second electrode
270 light

The invention claimed is:

1. An active matrix OLED display having pixels with light emitting areas arranged in rows and columns comprising;
   (a) a first pixel disposed in a first column of pixels and in a first row of pixels;
   (b) a second pixel disposed in the first column of pixels and in a second row of pixels wherein the second row of pixels is adjacent to the first row of pixels;
   (c) at least a third pixel disposed in a second column of pixels and in the first or second row of pixels wherein the second column of pixels is adjacent to the first column of pixels; and
   (d) first and second spaced select lines, first and second spaced data lines, and first and second spaced power lines arranged to drive the first, second and third pixels wherein the emitting areas of the first, second and third pixels are disposed between the first and second select lines, between the first and second data lines, and between the first and second power lines.

2. The active matrix OLED display of claim 1 wherein the first, second, and third pixels have different colors.

3. The active matrix OLED display of claim 1 wherein the emitting areas of at least two of the first, second, and third pixels have different sizes.

4. The active matrix OLED display of claim 1 wherein the first and second select lines, the first and second power lines, and the first and second data lines are linear.

5. The active matrix OLED display of claim 1 wherein the OLED display is bottom emitting.

6. The active matrix OLED display of claim 1 further including a fourth pixel disposed in the second column of pixels wherein the third pixel is disposed in the first row of pixels and the fourth pixel is disposed in the second row of pixels.

7. The active matrix OLED display of claim 6 wherein the first, second, third, and fourth pixels all have different emitting areas.

8. The active matrix OLED display of claim 6 wherein the pixels are red, green, blue and white.

* * * * *